United States Patent
Yun et al.

(10) Patent No.: US 9,263,576 B2
(45) Date of Patent: Feb. 16, 2016

(54) SEMICONDUCTOR DEVICE HAVING INTERCONNECTION LINE

(71) Applicants: Jang-Gn Yun, Gyeonggi-do (KR); Hoo-Sung Cho, Gyeonggi-do (KR); Jae-Sun Yun, Gyeonggi-do (KR)

(72) Inventors: Jang-Gn Yun, Gyeonggi-do (KR); Hoo-Sung Cho, Gyeonggi-do (KR); Jae-Sun Yun, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/576,257

(22) Filed: Dec. 19, 2014

(65) Prior Publication Data

US 2015/0380549 A1   Dec. 31, 2015

(30) Foreign Application Priority Data

Jun. 27, 2014   (KR) .................. 10-2014-0079905

(51) Int. Cl.
| | |
|---|---|
| *H01L 21/8242* | (2006.01) |
| *H01L 29/78* | (2006.01) |
| *H01L 23/528* | (2006.01) |
| *H01L 29/36* | (2006.01) |
| *H01L 27/088* | (2006.01) |

(52) U.S. Cl.
CPC .......... *H01L 29/7827* (2013.01); *H01L 23/528* (2013.01); *H01L 27/088* (2013.01); *H01L 29/36* (2013.01)

(58) Field of Classification Search
CPC ..................... H01L 27/11273; H01L 27/2454
USPC ........................................................ 438/253
See application file for complete search history.

(56) References Cited

U.S. PATENT DOCUMENTS

| | | | |
|---|---|---|---|
| 8,284,601 | B2 | 10/2012 | Son et al. |
| 8,358,539 | B2 | 1/2013 | Maeda |
| 8,530,956 | B2 | 9/2013 | Lee |
| 2013/0092994 | A1 | 4/2013 | Shim et al. |

FOREIGN PATENT DOCUMENTS

KR    1020130042272    4/2013

*Primary Examiner* — Elias M Ullah
(74) *Attorney, Agent, or Firm* — F. Chau & Associates, LLC

(57) ABSTRACT

Provided is a semiconductor device. The semiconductor device includes an insulating layer extending in a first direction. A first vertical channel pillar is disposed separately from the insulating layer. A first interconnection line extends in a second direction perpendicular to the first direction, and is electrically connected to the first vertical channel pillar. A first bit line extends in the second direction, and crosses over the first interconnection line and the first vertical channel pillar. A first bit contact overlaps the first interconnection line, and electrically connects the first interconnection line to the first bit line. A length of the first bit contact in the second direction is greater than a length of the first bit contact in the first direction.

20 Claims, 14 Drawing Sheets

SEMICONDUCTOR DEVICE HAVING INTERCONNECTION LINE

CROSS-REFERENCE TO RELATED APPLICATION

This application claims priority under 35 U.S.C. §119 to Korean Patent Application No. 10-2014-0079905 filed on Jun. 27, 2014, the disclosure of which is incorporated by reference herein in its entirety.

TECHNICAL FIELD

Exemplary embodiments of the present inventive concept relate to a semiconductor device, and more particularly to a semiconductor device including an interconnection line.

DISCUSSION OF RELATED ART

A semiconductor device may include gate electrodes stacked on a semiconductor substrate and vertical channel pillars which pass through the gate electrodes. Each of the vertical channel pillars may be electrically connected to a corresponding bit line through an interconnection line. When the intervals between the vertical channel pillars are reduced, undesired electrical connections or signal interference may occur between the interconnection lines or between the interconnection lines and the adjacent vertical channel pillars.

SUMMARY

Exemplary embodiments of the present inventive concept provide a semiconductor device stably connecting the interconnection lines, electrically connected to the vertical channel pillars, to bit lines.

The present inventive concept is not limited to the exemplary embodiments described herein and other embodiments may become apparent to those of ordinary skill in the art based on the following descriptions.

In accordance with an exemplary embodiment of the present inventive concept, a semiconductor device includes an insulating layer extending in a first direction. A first vertical channel pillar disposed separately from the insulating layer. A first interconnection line extends in a second direction perpendicular to the first direction, and is electrically connected to the first vertical channel pillar. A first bit line extends in the second direction. The first bit line crosses over the first interconnection line and the first vertical channel pillar. A first bit contact overlaps the first interconnection line, and electrically connects the first interconnection line to the first bit line. A length of the first bit contact in the second direction is greater than a length of the first bit contact in the first direction.

The first bit contact may include a portion overlapping the insulating layer.

The first bit contact may cross over the insulating layer.

A length of the first interconnection line in the first direction may be smaller than a diameter of the first vertical channel pillar.

The semiconductor device may include a second vertical channel pillar disposed separately from the insulating layer and the first vertical channel pillar. A second bit line may be disposed in parallel with the first bit line. The second bit line may cross over the second vertical channel pillar. The semiconductor device may include a second bit contact including a region on which the second bit line overlaps. The second bit line may electrically connect the second vertical channel pillar to the second bit line. A length of the second bit contact in the second direction may be greater than a length of the second bit contact in the first direction.

A shape of the second bit contact may be the same as a shape of the first bit contact.

The semiconductor device may include a second interconnection line disposed in parallel with the first interconnection line. The second interconnection line may electrically connect the second vertical channel pillar to the second bit contact. The second bit contact may overlap the second interconnection line.

A length of the second interconnection line in the second direction may be greater than a length of the first interconnection line in the second direction.

In accordance with an exemplary embodiment of the present inventive concept, a semiconductor device includes a plurality of gate electrodes stacked on a semiconductor substrate. A first vertical channel pillars penetrates the plurality of gate electrodes. A first bit line disposed on the gate electrodes. The first bit line crosses over the first vertical channel pillars. An interconnection line is disposed between the first vertical channel pillar and the first bit line. The interconnection line extends along the first bit line. A first bit contact is disposed between the interconnection line and the first bit line. A horizontal length of the first bit contact is greater than a horizontal length of the first vertical channel pillar.

The semiconductor device may include a second vertical channel pillar penetrating the gate electrodes. The second vertical channel pillar is spaced apart from the first vertical channel pillar. A second bit line is disposed on the gate electrodes. The second bit line crosses over the second vertical channel pillar. A second bit contact is disposed between the second vertical channel pillar and the second bit line.

A horizontal length of the second bit contact may be greater than a horizontal length of the second vertical channel pillar.

The semiconductor device may include an interconnection contact disposed between the second vertical channel pillar and the second bit contact.

A level of a lower surface level of the second bit contact may be the same as a level of a lower surface of the first bit contact.

A level of a lower surface level of the second bit contact may be higher than a level of an upper surface of the interconnection line.

In accordance with an exemplary embodiment of the present inventive concept, a semiconductor device may include a first vertical channel pillar, a bit line crossing over the first vertical channel pillar. An interconnection line may overlap the first vertical channel pillar, and may extend along the bit line. A bit contact may overlap the interconnection line, and extend along the interconnection line.

BRIEF DESCRIPTION OF THE DRAWINGS

The above and other features of the inventive concept will become more apparent by describing in detail exemplary embodiments thereof, with reference to the accompanying drawings in which.

DETAILED DESCRIPTION OF THE EMBODIMENTS

Figure 1:
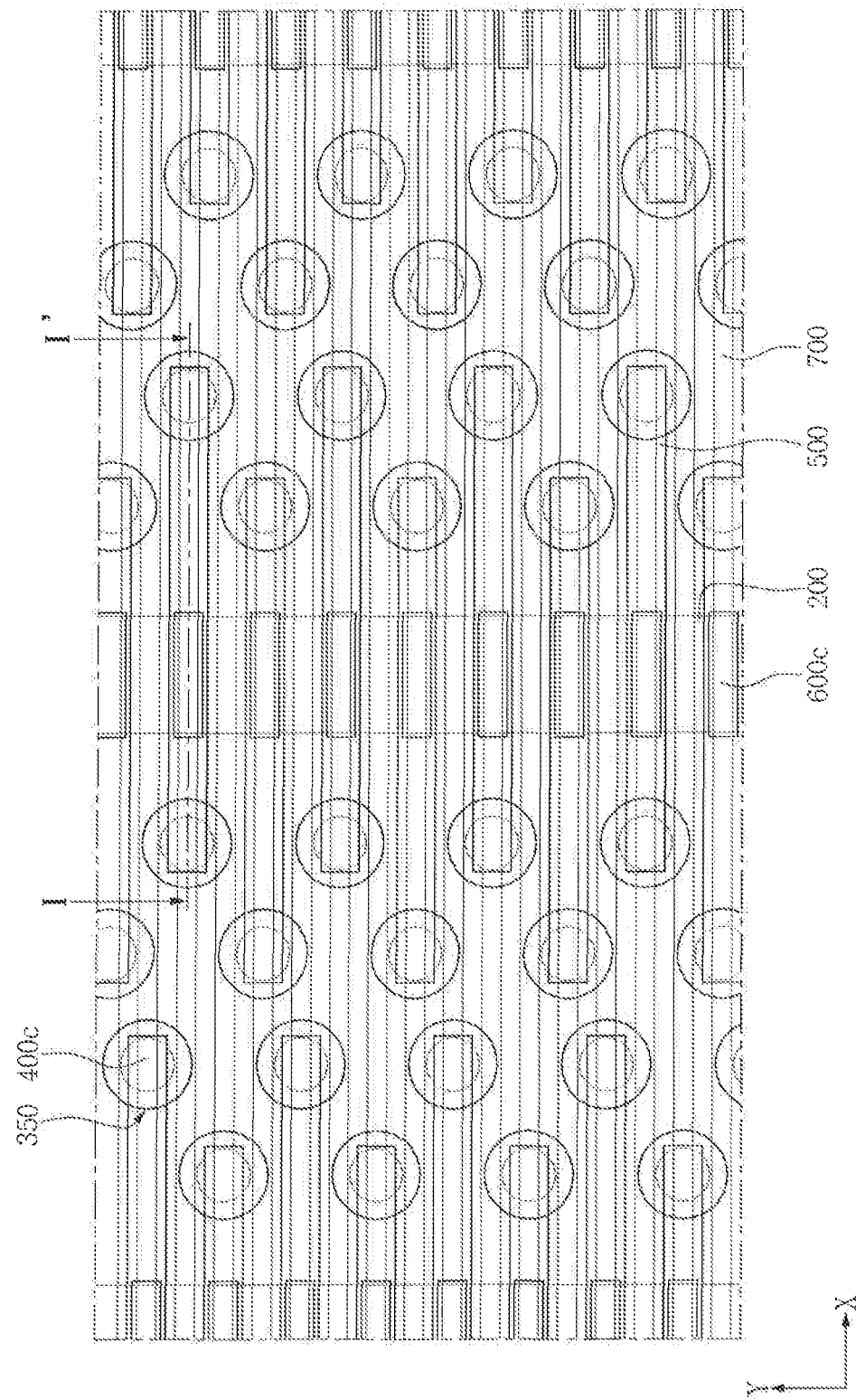
FIG. 1 is a view illustrating a layout of a semiconductor device in accordance with an exemplary embodiment of the present inventive concept.

Exemplary embodiments of the present inventive concept will now be more fully described with reference to the accompanying drawings in which exemplary embodiments are shown. The present inventive concept may be embodied in various different forms and should not be construed as limited to the embodiments set forth herein.

Like numerals may refer to like elements throughout the specification and drawings. In the drawings, the lengths and thicknesses of layers and regions may be exaggerated for clarity. It will be understood that when a first element is referred to as being "on" a second element, the first element may be directly on the second element, or a third element may be interposed between the first element and the second element.

The terms "first" and "second," may be used to distinguish one element, component, region, layer, or section from another region, layer, or section. Thus, a first element, component, region, layer, or section discussed below could be termed a second element, component, region, layer, or section without departing from the present inventive concept.

Figure 2:
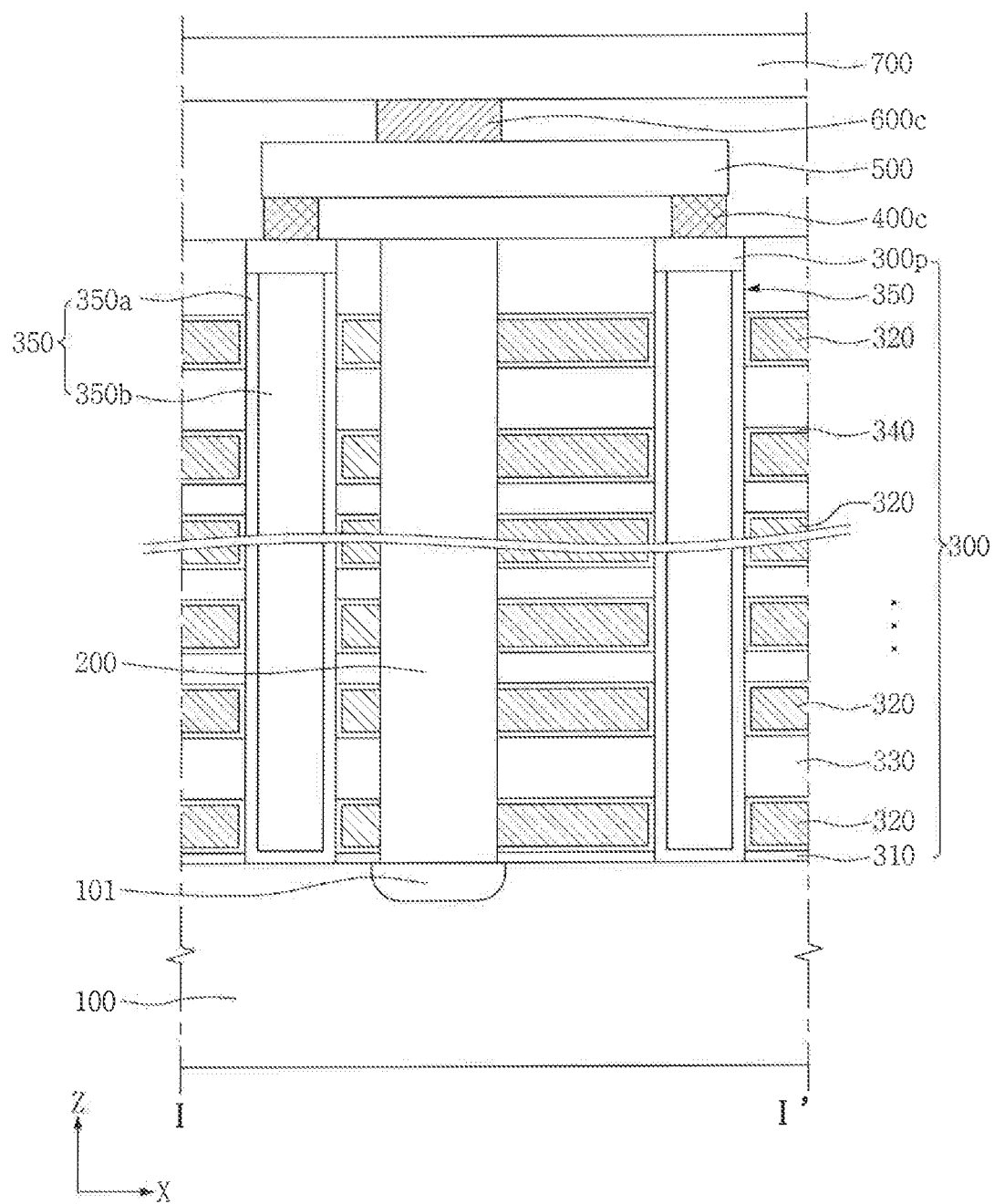
FIG. 2 is a cross-sectional view taken along line I-I' in FIG. 1.

FIG. 1 is a view illustrating a layout of a semiconductor device in accordance with an exemplary embodiment of the present inventive concept. FIG. 2 is a cross-sectional view taken along line I-I' in FIG. 1.

Referring to FIGS. 1 and 2, the semiconductor device according to an exemplary embodiment of the present inventive concept may include a semiconductor substrate 100, insulating layers 200, cell structures 300, channel contacts 400c, interconnection lines 500, bit contacts 600c, and bit lines 700.

The semiconductor substrate 100 may include a silicon wafer or a silicon-on-insulator (SOI) substrate. The semiconductor substrate 100 may include impurity regions 101. The impurity regions 101 may serve as common source regions. Each of the impurity regions 101 may be spaced apart from the adjacent impurity region 101 in an X-axis direction. The impurity regions 101 may extend in a Y-axis direction. The impurity regions 101 may include a conductive impurity. For example, the impurity regions 101 may include an N-type impurity.

The insulating layers 200 may be disposed on the semiconductor substrate 100. The insulating layers 200 may be disposed on the impurity regions 101 of the semiconductor substrate 100. Each of the insulating layers 200 may be spaced apart from the adjacent insulating layer 200 in the X-axis direction. The insulating layers 200 may extend in the Y-axis direction. The insulating layers 200 may include an insulating material. For example, the insulating layers 200 may include silicon oxide.

The cell structures 300 may be disposed on the semiconductor substrate 100. Each of the cell structures 300 may be disposed between the insulating layers 200. An upper surface level of the cell structures 300 may be the same as that of the insulating layers 200.

The cell structures 300 may include a buffer insulating layer 310, gate electrodes 320, insulating patterns 330, data storage patterns 340, and vertical channel pillars 350.

The buffer insulating layer 310 may be disposed near the semiconductor substrate 100. The buffer insulating layer 310 may include an insulating material. For example, the buffer insulating layer 310 may include silicon oxide.

The gate electrodes 320 may be disposed on the buffer insulating layer 310. The gate electrodes 320 may be stacked in a Z-axis direction. The gate electrodes 320 may include a conductive material. For example, the gate electrodes 320 may include a metal or poly-silicon.

The insulating patterns 330 may be disposed between the gate electrodes 320. The gate electrodes 320 and the insulating patterns 330 may be alternately stacked on the semiconductor substrate 100. The insulating patterns 330 may include an insulating material. For example, the insulating patterns 330 may include silicon oxide.

The data storage patterns 340 may be disposed on the gate electrodes 320. The data storage patterns 340 may extend along a surface of the gate electrodes 320. The data storage patterns 340 may be disposed between the gate electrodes 320 and the insulating patterns 330.

The data storage patterns 340 may store data according to a signal applied to the gate electrodes 320. For example, the data storage patterns 340 may include a material which stores data according to a voltage applied to the gate electrodes 320. For example, the data storage patterns 340 may include a material whose resistance varies due to heat generated by the gate electrodes 320.

The vertical channel pillars 350 may extend in the Z-axis direction. The vertical channel pillars 350 may pass through the gate electrodes 320 and the insulating patterns 330. The vertical channel pillars 350 may be electrically connected to the semiconductor substrate 100. For example, the vertical channel pillars 350 may be in direct contact with the semiconductor substrate 100.

The vertical channel pillars 350 may include a channel active pattern 350*a* and a channel core pattern 350*b*.

The channel active pattern 350*a* may be disposed near the gate electrodes 320. The data storage patterns 340 may be disposed between the gate electrodes 320 and the channel active pattern 350*a*. The channel active pattern 350*a* may extend along each side surface of the gate electrodes 320 and the insulating patterns 330.

The channel active pattern 350*a* may serve as a channel according to a signal applied to the gate electrodes 320. The channel active pattern 350*a* may include a semiconductor material. For example, the channel active pattern 350*a* may include poly-silicon.

The channel core pattern 350*b* may be surrounded by the channel active pattern 350*a*. The channel core pattern 350*b* may fill a space between vertical regions of the channel active pattern 350*a*. The channel core pattern 350*b* may include an insulating material. For example, the channel core pattern 350*b* may include silicon oxide.

In the semiconductor device according to an exemplary embodiment of the present inventive concept, the vertical channel pillars 350 may be misaligned between the insulating layers 200 in the Y-axis direction. For example, in the semiconductor device according to an exemplary embodiment of the present inventive concept, the vertical channel pillars 350 may be arranged in 4 rows and may be disposed between the insulating layers 200. The vertical channel pillars 350 of each row may be spaced apart in the Y-axis direction.

In the semiconductor device according to an exemplary embodiment of the present inventive concept the cell structures 300 may include channel pads 300*p*. The channel pads 300*p* may be disposed on the vertical channel pillars 350 of the cell structures 300. The channel pads 300*p* may serve as drain regions. For example, the channel pads 300*p* may include poly-silicon.

The channel contacts 400*c* may be disposed on the vertical channel pillars 350. The channel contacts 400*c* may be electrically connected to the vertical channel pillars 350 through the channel pads 300*p*. The channel contacts 400*c* may be in direct contact with the channel pads 300*p*. The channel contacts 400*c* may include a conductive material. For example, the channel contacts 400*c* may include a metal or metal silicide.

The interconnection lines 500 may be disposed on the cell structures 300. The interconnection lines 500 may be electrically connected to the vertical channel pillars 350 through the channel contacts 400*c*. The interconnection lines 500 may be in direct contact with the channel contacts 400*c*. The interconnection lines 500 may include a conductive material. For example, the interconnection lines 500 may include a metal or metal silicide.

The interconnection lines 500 may extend into the X-axis direction. The interconnection lines 500 may be spaced apart from the adjacent interconnection line 500 in the Y-axis direction. The interconnection lines 500 may have a constant length in the Y-axis direction. For example, the interconnection lines 500 may have a rectangular shape extending into the X-axis direction.

In the semiconductor device according to an exemplary embodiment of the present inventive concept, the interconnection lines 500 each may be electrically connected to one of the vertical channel pillars 350 between the insulating layers 200. Thus, in the semiconductor device according to an exemplary embodiment of the present inventive concept, a distance between the interconnection lines 500 in the Y-axis direction may be the same as a distance between the vertical channel pillars 350 in the Y-axis direction.

The interconnection lines 500 may cross over the insulating layers 200. The interconnection lines 500 may be electrically connected to two vertical channel pillars 350 and one of the insulating layers 200 may be disposed between the two vertical channel pillars 350.

In the semiconductor device according to an exemplary embodiment of the present inventive concept, the interconnection lines 500 may cross over the insulating layer 200 and may be electrically connected to the two vertical channel pillars 350. In the semiconductor device according to an exemplary embodiment of the present inventive concept, a distance between the vertical channel pillar 350, which may be electrically connected to one side of the interconnection line 500, and the insulating layer 200 may be different from a distance between the vertical channel pillar 350, which may be electrically connected to the other side of the corresponding interconnection line 500, and the insulating layer 200. For example, in the semiconductor device according to an exemplary embodiment of the present inventive concept, an arrangement of the vertical channel pillars 350, which may be electrically connected to one side of the interconnection line 500, of the cell structure 300 may be the same as a shifted arrangement of the vertical channel pillars 350, which may be electrically connected to the other side of the corresponding interconnection line 500, of the adjacent cell structure 300 in the Y-axis direction.

A length of each interconnection line 500 in the Y-axis direction may be smaller than that of each vertical channel pillar 350 in the Y-axis direction. The length of each interconnection line 500 in the Y-axis direction may be smaller than that of each channel contact 400*c* in the Y-axis direction.

In the semiconductor device according to the an exemplary embodiment of the present inventive concept, the length of each interconnection line 500 in the Y-axis direction may be smaller than a diameter of each channel contact 400*c*. In the semiconductor device according to an exemplary embodiment of the present inventive concept, the interconnection lines 500 may be sufficiently spaced apart from each other. In the semiconductor device according to an exemplary embodiment of the present inventive concept, each interconnection line 500 may be sufficiently spaced apart from the adjacent vertical channel pillar 350.

The bit contacts 600*c* may be disposed on the interconnection lines 500. The bit contacts 600*c* may vertically overlap the interconnection lines 500. A length of each bit contact 600*c* in the X-axis direction may be smaller than that of each interconnection line 500 in the X-axis direction. The length of each bit contact 600*c* in the Y-axis direction may be smaller than that of each interconnection line 500 in the Y-axis direction.

The bit contacts 600*c* may be electrically connected to the interconnection lines 500. The bit contacts 600*c* may be in direct contact with the interconnection lines 500. The bit contacts 600*c* may include a conductive material. For example, the bit contacts 600*c* may include a metal or metal silicide.

The bit contacts 600*c* may be spaced apart from the vertical channel pillars 350. For example, the bit contacts 600*c* may be disposed over the insulating layers 200. A distance between the vertical channel pillar 350, which may be electrically connected to one side of the interconnection line 500, and the corresponding bit contact 600*c* may be different from a distance between the vertical channel pillar 350, which may be electrically connected to the other side of the interconnection line 500, and the corresponding bit contact 600*c*.

The bit contacts 600*c* may extend along the interconnection lines 500. The bit contacts 600*c* may extend into the X-axis direction. A length of each bit contact 600c in the X-axis direction may be greater than that of each bit contact 600c in the Y-axis direction. The bit contacts 600c may have a bar shape extending in the X-axis direction. The length of each bit contact 600c in the X-axis direction may be greater than that of each insulating layer 200 in the X-axis direction. The bit contacts 600c may cross over the insulating layers 200.

The bit lines 700 may be disposed on the bit contacts 600c. The bit lines 700 may extend in the X-axis direction. The bit lines 700 may cross the bit contacts 600c. The bit lines 700 may be electrically connected to the bit contacts 600c. The bit lines 700 may be in direct contact with the bit contacts 600c. The bit lines 700 may include a conductive material. For example, the bit lines 700 may include a metal or metal silicide.

In the semiconductor device according to an exemplary embodiment of the present inventive concept, each of the bit lines 700 may be electrically connected to one of the interconnection lines 500 through the corresponding bit contact 600c. In the semiconductor device according to an exemplary embodiment of the present inventive concept, the interconnection lines 500, the bit contacts 600c and the bit lines 700 may vertically overlap. In the semiconductor device according to an exemplary embodiment of the present inventive concept, the interconnection lines 500 and the bit contacts 600c may extend in the same direction as the bit lines 700. In the semiconductor device according to an exemplary embodiment of the present inventive concept, each of the interconnection lines 500 may be stably connected to the corresponding bit line 700. In the semiconductor device according to an exemplary embodiment of the present inventive concept, reliability thereof may be increased.

Figure 3:
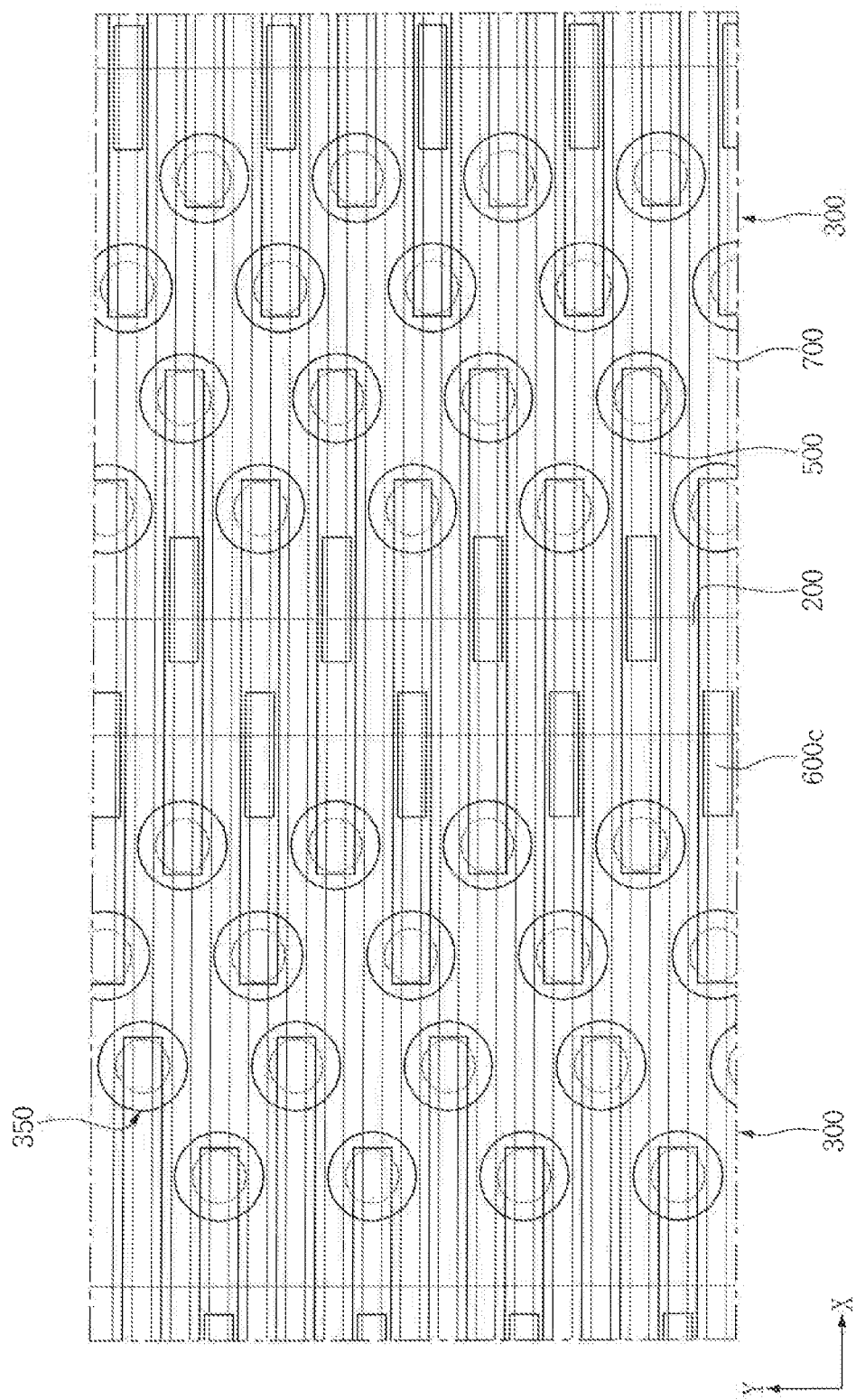
FIG. 3 is a view illustrating a layout of a semiconductor device in accordance with an exemplary embodiment of the present inventive concept.

FIG. 3 is a view illustrating a layout of a semiconductor device in accordance with an exemplary embodiment of the present inventive concept.

Referring to FIG. 3, the semiconductor device according to an exemplary embodiment of the present inventive concept may include insulating layers 200 extending in the Y-axis direction, cell structures 300 disposed between the insulating layers 200, interconnection lines 500 extending in the X-axis direction, bit contacts 600c overlapping the interconnection lines 500, and bit lines 700 extending in the X-axis direction. The cell structures 300 may include vertical channel pillars 350 electrically connected to one of the bit lines 700 through the interconnection line 500 and the bit contact 600c.

The interconnection lines 500 may be electrically connected to two vertical channel pillars 350 spaced apart by one of the insulating layers 200. A distance between the vertical channel pillar 350, which may be electrically connected to one side of the corresponding interconnection line 500, and the insulating layer 200 may be different from a distance between the vertical channel pillar 350, which may be electrically connected to the other side of the corresponding interconnection line 500, and the insulating layer 200.

The bit contacts 600c may partly overlap the insulating layers 200. For example, the bit contacts 600c may include one end portion overlapping the insulating layer 200. A distance between the vertical channel pillar 350, which may be electrically connected to the one side of the interconnection line 500, and the corresponding bit contact 600c may be the same as a distance between the vertical channel pillar 350, which may be electrically connected to the other side of the interconnection line 500, and the corresponding bit contact 600c. For example, the bit contacts 600c may be disposed in a zigzag form on the corresponding insulating layers 200 which cross the corresponding interconnection line 500.

In the semiconductor device according to an exemplary embodiment of the present inventive concept, the bit contacts 600c may be misaligned on the insulating layers 200. In the semiconductor device according to an exemplary embodiment of the present inventive concept, the bit contacts 600c may be sufficiently spaced apart from each other. In the semiconductor device according to an exemplary embodiment of the present inventive concept, reliability thereof may be increased.

Figure 4:
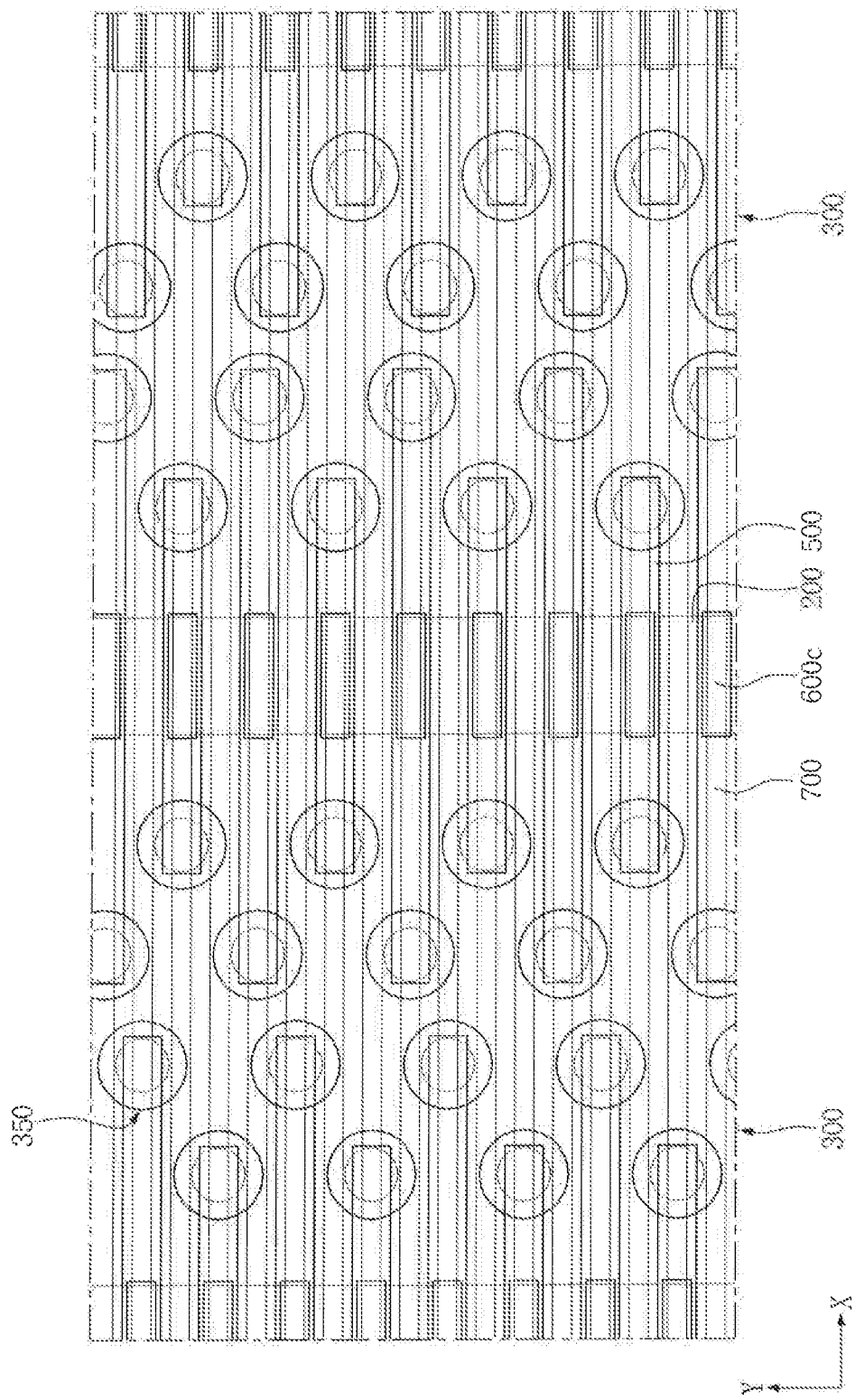
FIG. 4 is a view illustrating a layout of a semiconductor device in accordance with an exemplary embodiment of the present inventive concept.

FIG. 4 is a view illustrating a layout of a semiconductor device in accordance with an exemplary embodiment of the present inventive concept.

Referring to FIG. 4, the semiconductor device according to an exemplary embodiment of the present inventive concept may include insulating layers 200, cell structures 300 including vertical channel pillars 350, interconnection lines 500, bit contacts 600c, and bit lines 700.

The interconnection lines 500 may be electrically connected to two vertical channel pillars 350 spaced apart by one of the insulating layers 200. A distance between the vertical channel pillar 350, which may be electrically connected to one side of the interconnection line 500, and the insulating layer 200 may be the same as a distance between the vertical channel pillar 350, which may be electrically connected to the other side of the interconnection line 500, and the corresponding insulating layer 200. An arrangement of the vertical channel pillars 350 in adjacent cell structures 300 may be symmetrical based on the insulating layers 200.

Figure 5:
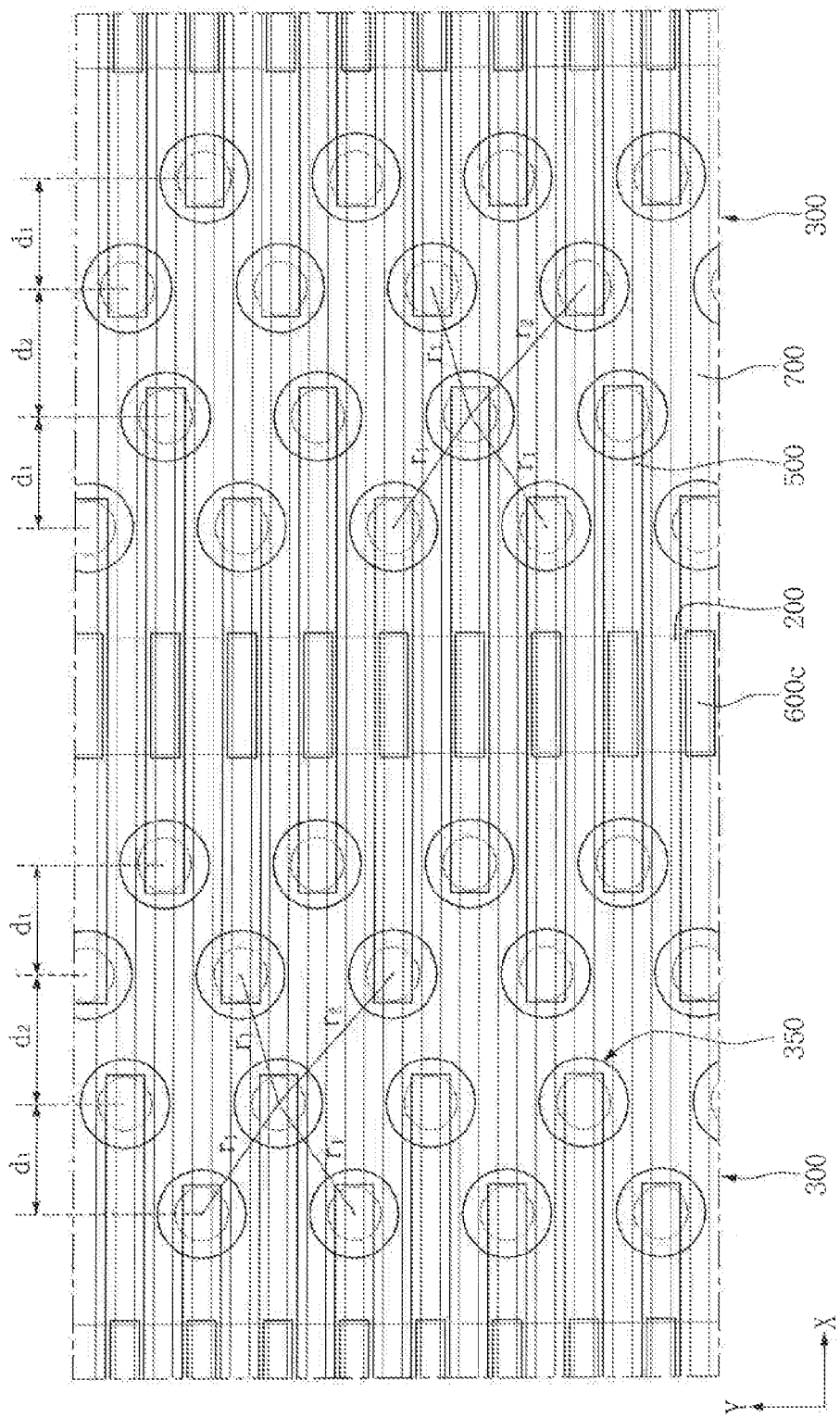
FIG. 5 is a view illustrating a layout of a semiconductor device in accordance with an exemplary embodiment of the present inventive concept.

FIG. 5 is a view illustrating a layout of a semiconductor device in accordance with an exemplary embodiment of the present inventive concept.

Referring to FIG. 5, the semiconductor device according to an exemplary embodiment of the present inventive concept may include insulating layers 200, cell structures 300, interconnection lines 500, bit contacts 600c, and bit lines 700.

The cell structures 300 may include vertical channel pillars 350. The vertical channel pillars 350 may be arranged in a plurality of rows in an X-axis direction. For example, the vertical channel pillars 350 may be arranged in four rows in the X-axis direction.

In the semiconductor device according to an exemplary embodiment of the present inventive concept, distances in the X-axis direction between adjacent vertical channel pillars 350 may be different. For example, in the semiconductor device according to an exemplary embodiment of the present inventive concept, each of the cell structures 300 may includes 4 rows of the vertical channel pillars 350 in the X-axis direction. A distance d2 in the X-axis direction between adjacent vertical channel pillars 350 arranged in a center region in the X-axis direction may be greater than a distance d1 in the X-axis direction between adjacent vertical channel pillars 350 disposed near the insulating layers 200. In the semiconductor device according to an exemplary embodiment of the present inventive concept, the distance in the X-axis direction between the adjacent vertical channel pillars 350 arranged in the center region in X-axis direction between the insulating layers 200 may be equal to or greater than the distance in the X-axis direction between the adjacent vertical channel pillars 350 disposed near the insulating layers 200. In the semiconductor device according to an exemplary embodiment of the present inventive concept, reliability thereof may be increased.

Figure 6:
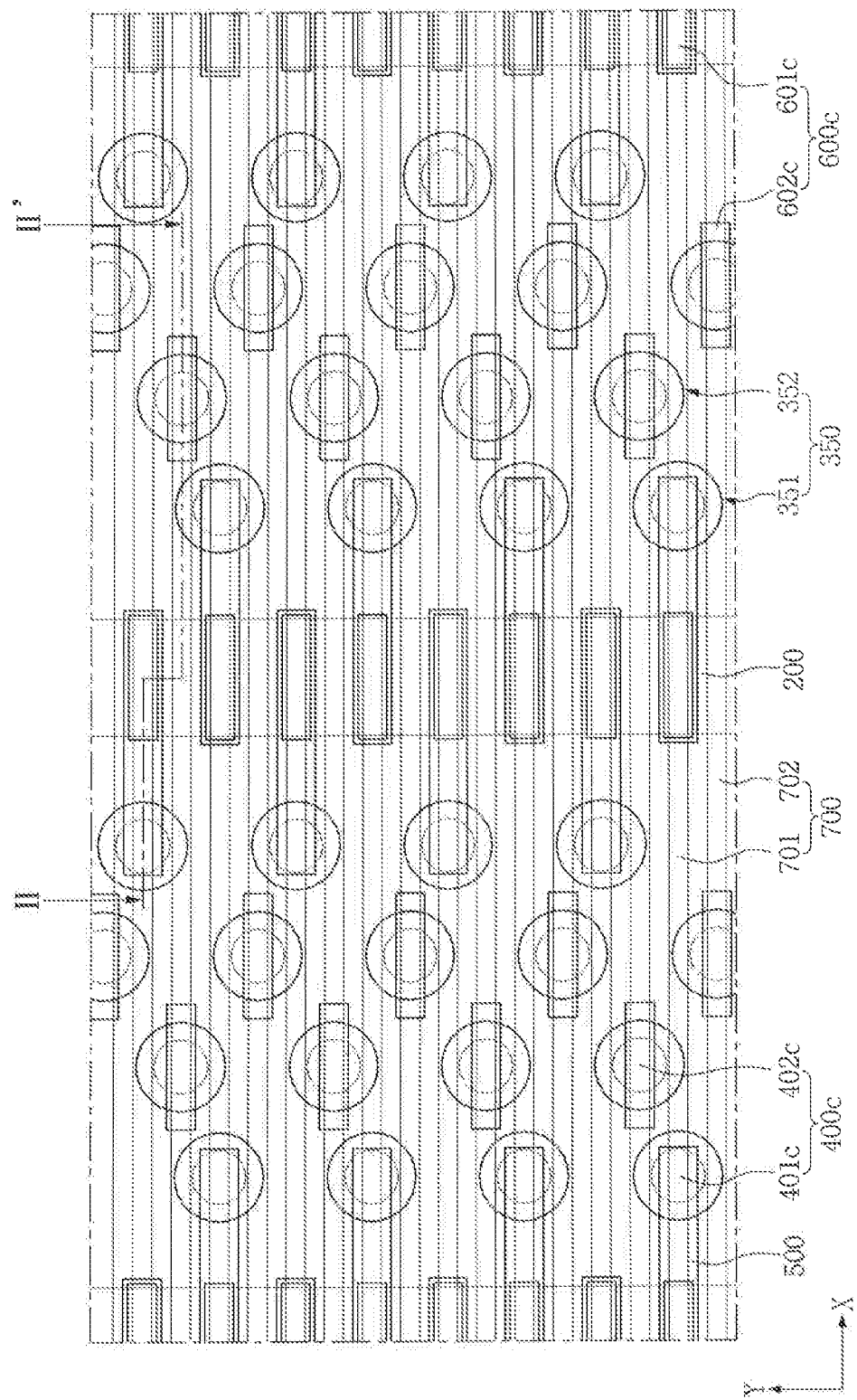
FIG. 6 is a view illustrating a layout of a semiconductor device in accordance with an exemplary embodiment of the present inventive concept.
Figure 7:
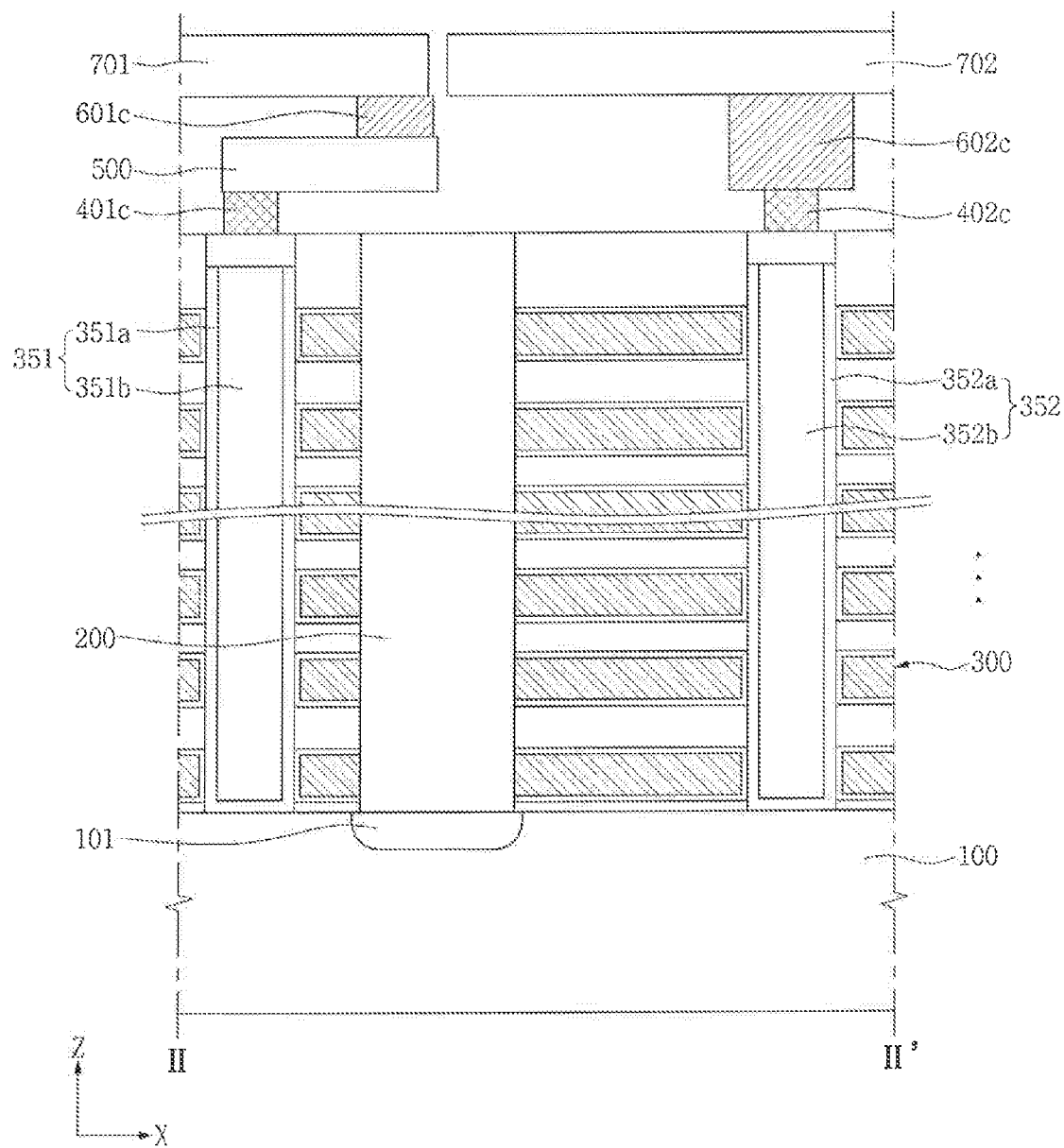
FIG. 7 is a cross-sectional view taken along line II-II' in FIG. 6.

FIG. 6 is a view illustrating a layout of a semiconductor device in accordance with an exemplary embodiment of the present inventive concept. FIG. 7 is a cross-sectional view taken along line II-II' in FIG. 6.

Referring to FIGS. 6 and 7, the semiconductor device according to an exemplary embodiment of the present inventive concept may include the semiconductor substrate 100, insulating layers 200, cell structures 300 including vertical channel pillars 350, channel contacts 400c, interconnection lines 500, bit contacts 600c, and bit lines 700.

The vertical channel pillars 350 may include a first vertical channel pillar 351 and a second vertical channel pillar 352. The first vertical channel pillars 351 may be disposed near the insulating layers 200. The second vertical channel pillars 352 may be disposed in a center region of the corresponding cell structure 300 in the X-axis direction. The second vertical channel pillars 352 may be disposed between the first vertical channel pillars 351. For example, each of the cell structures 300 may includes 4 rows of the vertical channel pillars 350 in the X-axis direction.

The first vertical channel pillars 351 may include a first channel active pattern 351a and a first channel core pattern 351b. The second vertical channel pillars 352 may have the same structure as the first vertical channel pillars 351. The second vertical channel pillars 352 may include a second channel active pattern 352a and a second channel core pattern 352b.

The channel contacts 400c may include a first channel contact 401c and a second channel contact 402c. The first channel contacts 401c may be disposed over the first vertical channel pillars 351. The first channel contacts 401c may be electrically connected to the first vertical channel pillars 351. The second channel contacts 402c may be disposed over the second vertical channel pillars 352. The second channel contacts 402c may be electrically connected to the second vertical channel pillars 352. A length of each second channel contact 402c in a Z-axis direction may be the same as a length of each first channel contact 401c in the Z-axis direction.

The interconnection lines 500 may be electrically connected to the first vertical channel pillars 351. The interconnection lines 500 may be in direct contact with the first channel contacts 401c. The interconnection lines 500 may extend into the X-axis direction.

The bit contacts 600c may include a first bit contact 601c and a second bit contact 602c.

The first bit contacts 601c may be disposed on the interconnection lines 500. The first bit contacts 601c may vertically overlap the interconnection lines 500. The first bit contacts 601c may extend along the interconnection lines 500. For example, the first bit contacts 601c may extend in the X-axis direction. A length of each first bit contact 601c in the X-axis direction may be greater than a length of each first bit contact 601c in the Y-axis direction.

The second bit contacts 602c may be disposed over the second vertical channel pillars 352. The second bit contacts 602c may be in direct contact with the second channel contacts 402c. A lower surface level of the second bit contacts 602c may be the same as a lower surface level of the interconnection lines 500. The second channel contacts 402c may be disposed between the second vertical channel pillars 352 and the second bit contacts 602c.

The second bit contacts 602c may extend in the X-axis direction. A length of the second bit contacts 602c in the X-axis direction may be greater than a length of the second bit contacts 602c in the Y-axis direction. For example, a horizontal shape of the second bit contacts 602c may be the same as a horizontal shape of the first bit contacts 601c.

An upper surface level of the second bit contacts 602c may be the same as an upper surface level of the first bit contacts 601c. A length of the second bit contacts 602c in the Z-axis direction may be different from a length of the first bit contacts 601c in the Z-axis direction. A difference between the length of the second bit contacts 602c in the Z-axis direction and the length of the first bit contacts 601c in the Z-axis direction may be the same as a length of the interconnection lines 500 in the Z-axis direction.

The bit lines 700 may include a first bit line 701 and a second bit line 702. The first bit lines 701 and the second bit lines 702 may extend into the X-axis direction. The first bit lines 701 may be electrically connected to the first bit contacts 601c. The first bit lines 701 may be electrically connected to the first vertical channel pillars 351 through the interconnection lines 500 and the first bit contacts 601c. The second bit lines 702 may be electrically connected to the second bit contacts 602c. The second bit lines 702 may be electrically connected to the second vertical channel pillars 352 through the second bit contacts 602c.

In the semiconductor device according to an exemplary embodiment of the present inventive concept, the first bit lines 701 may be electrically connected to the first bit contacts 601c over the insulating layers 200, and the second bit lines 702 may be electrically connected to the second bit contacts 602c over the second vertical channel pillars 352. In the semiconductor device according to an exemplary embodiment of the present inventive concept, the bit contacts 600c may be sufficiently spaced apart from each other. In the semiconductor device according to an exemplary embodiment of the present inventive concept, reliability thereof may be increased.

Figure 8:
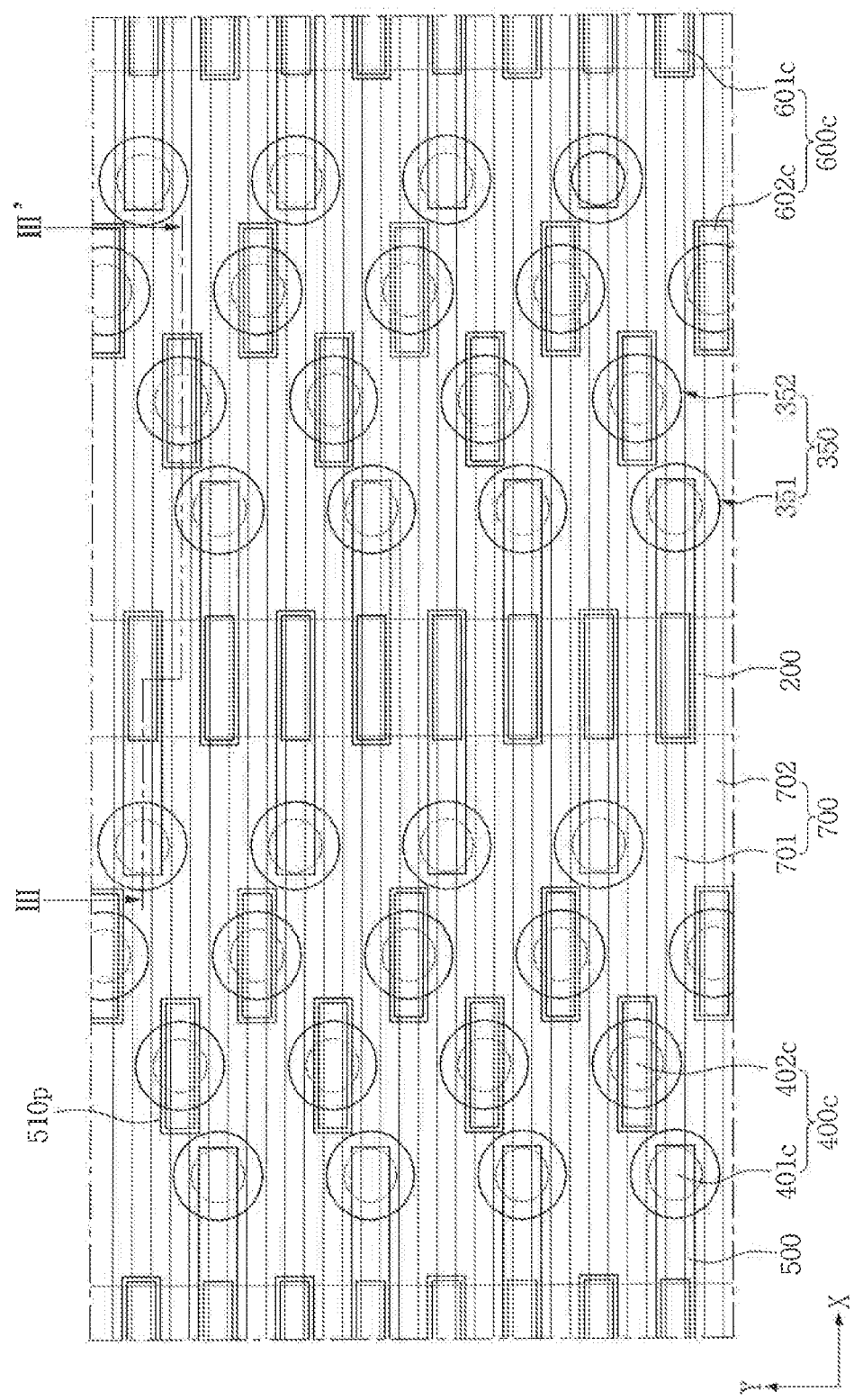
FIG. 8 is a view illustrating a layout of a semiconductor device in accordance with an exemplary embodiment of the present inventive concept.
Figure 9:
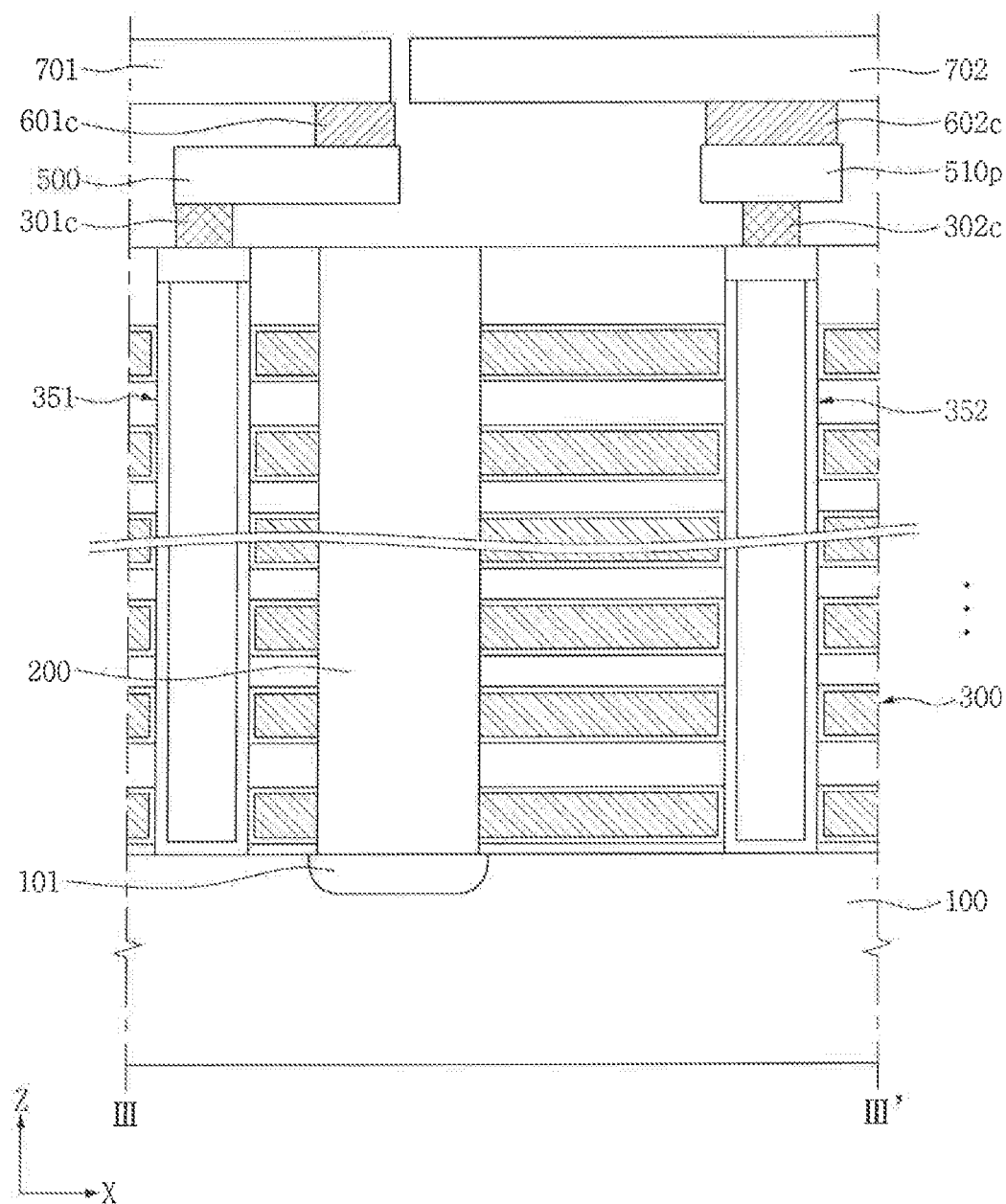
FIG. 9 is a cross-sectional view taken along line III-III' in FIG. 8.

FIG. 8 is a view illustrating a layout of a semiconductor device in accordance with an exemplary embodiment of the present inventive concept. FIG. 9 is a cross-sectional view taken along line III-III' in FIG. 8.

Referring to FIGS. 8 and 9, the semiconductor device may include the semiconductor substrate 100, insulating layers 200, cell structures 300, channel contacts 400c, interconnection lines 500, connection pads 510p, bit contacts 600c, and bit lines 700.

The cell structures 300 may include vertical channel pillars 350. The vertical channel pillars 350 may include the first vertical channel pillar 351 and the second vertical channel pillar 352. The channel contacts 400c may include the first channel contact 401c and the second channel contact 402c. The bit contacts 600c may include the first bit contact 601c and the second bit contact 602c. The bit lines 700 may include the first bit line 701 and the second bit line 702.

The connection pads 510p may be disposed between the second channel contacts 402c and the second bit contacts 602c. The second bit contacts 602c may be electrically connected to the corresponding second vertical channel pillar 352 through the corresponding connection pad 510p. The connection pads 510p may include a conductive material. For example, the connection pads 510p may include a metal or metal silicide.

A length of the connection pads 510p in a Z-axis direction may be the same as a length of the interconnection lines 500 in the Z-axis direction. A lower surface level of the second bit contacts 602c may be the same as a lower surface level of the first bit contacts 601c.

A length of the connection pads 510p in an X-axis direction may be greater than a length of the second bit contacts 602c in the X-axis direction. A length of the connection pads 510p in a Y-axis direction may be greater than a length of the second bit contacts 602c in the Y-axis direction. A horizontal area of each connection pad 510p may be greater than a horizontal area of each second bit contact 602c.

In the semiconductor device according to an exemplary embodiment of the present inventive concept, the second bit contacts 602c may be electrically connected to the second vertical channel pillars 352 through the connection pads 510p. In the semiconductor device according to an exemplary embodiment of the present inventive concept, the second bit contacts 602c may be stably connected to the second vertical channel pillars 352. In the semiconductor device according to an exemplary embodiment of the present inventive concept, reliability thereof may be improved.

Figure 10:
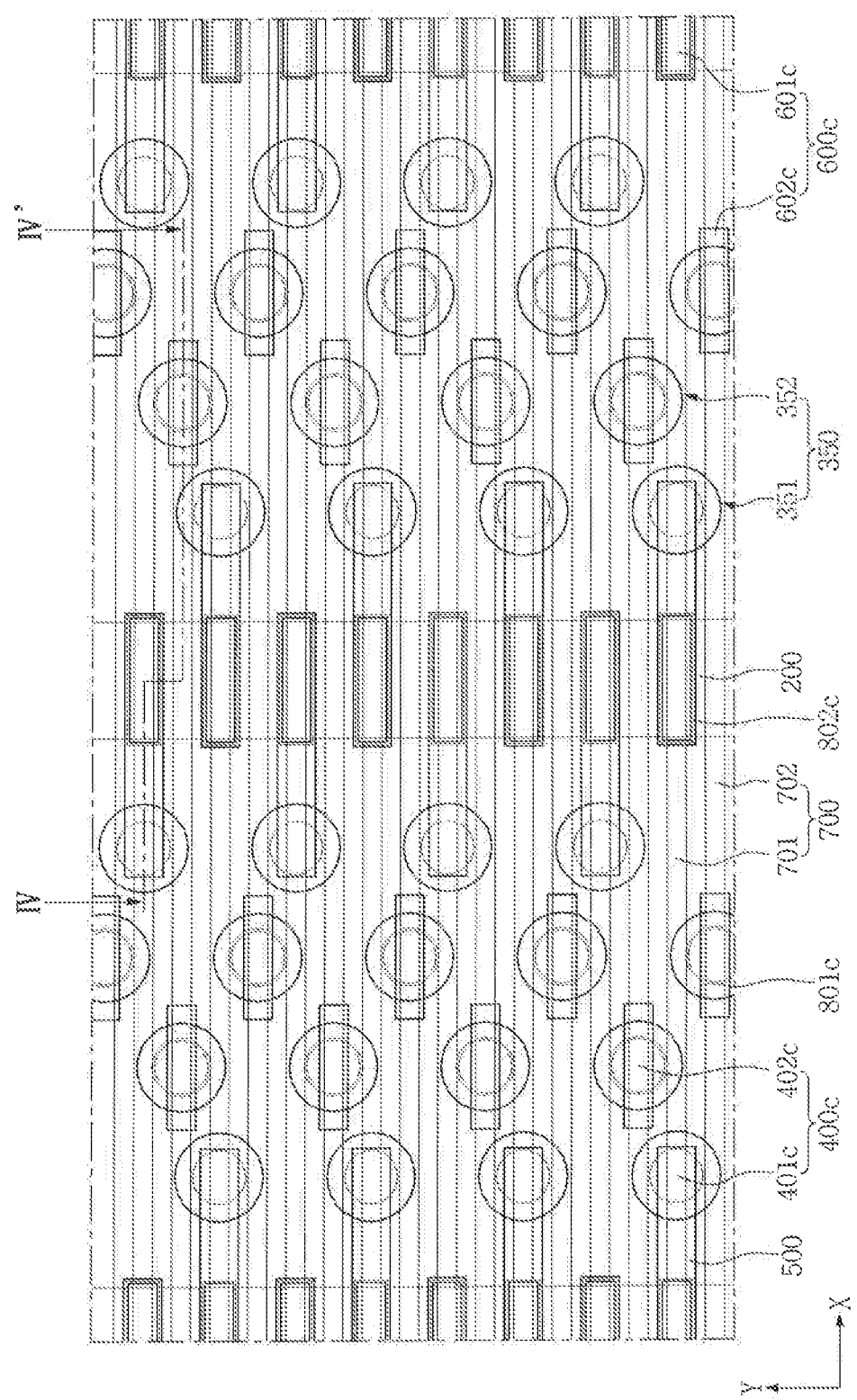
FIG. 10 is a view illustrating a layout of a semiconductor device in accordance with an exemplary embodiment of the present inventive concept.
Figure 11:
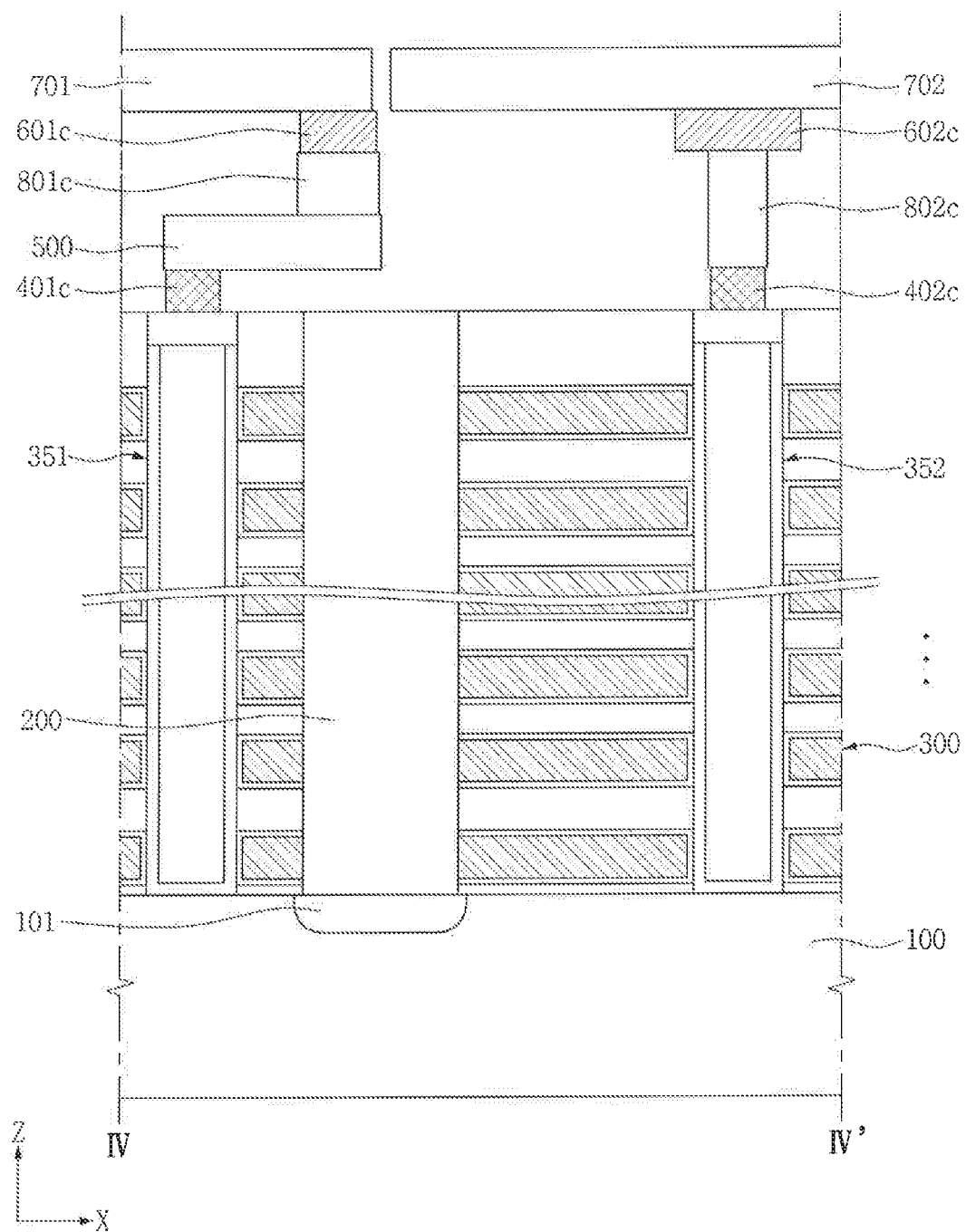
FIG. 11 is a cross-sectional view taken along line IV-IV' in FIG. 10.

FIG. 10 is a view illustrating a layout of a semiconductor device in accordance with an exemplary embodiment of the present inventive concept. FIG. 11 is a cross-sectional view taken along line IV-IV' in FIG. 10.

Referring to FIGS. 10 and 11, the semiconductor device may include the semiconductor substrate 100, insulating layers 200, cell structures 300 including vertical channel pillars 350, channel contacts 400c including first channel contacts 401c and second channel contacts 402c, interconnection lines 500, bit contacts 600c including first bit contacts 601c and second bit contacts 602c, bit lines 700 including first bit lines 701 and second bit lines 702, first interconnection contacts 801c, and second interconnection contacts 802c. The vertical channel pillars 350 may include the first vertical channel pillar 351 and the second vertical channel pillar 352.

The first interconnection contacts 801c may be disposed between the interconnection lines 500 and the first bit contacts 601c. The first interconnection contacts 801c may be in direct contact with the interconnection lines 500 and the first bit contacts 601c.

A length of the first interconnection contacts 801c in an X-axis direction may be greater than a length of the first bit contacts 601c in the X-axis direction. The length of the first interconnection contacts 801c in the X-axis direction may be smaller than a length of the interconnection lines 500 in the X-axis direction. A length of the first interconnection contacts 801c in a Y-axis direction may be greater than a length of the first bit contacts 601c in the Y-axis direction. The length of the first interconnection contacts 801c in the Y-axis direction may be smaller than a length of the interconnection lines 500 in the Y-axis direction. The first interconnection contacts 801c may be disposed over the insulating layers 200.

The second interconnection contacts 802c may be disposed between the second vertical channel pillars 352 and the second bit contacts 602c. The second interconnection contacts 802c may be in direct contact with the second channel contacts 402c and the second bit contacts 602c. A level of a lower surface of the second bit contacts 602c may be higher than a level of an upper surface of the interconnection lines 500.

A length of the second interconnection contacts 802c in the X-axis direction may be smaller than a length of the second bit contacts 602c in the X-axis direction. A length of the second interconnection contacts 802c in the X-axis direction may be greater than a length of the second channel contacts 402c in the X-axis direction. A length of the second interconnection contacts 802c in the Y-axis direction may be greater than a length of the second bit contacts 602c in the Y-axis direction. A length of the second interconnection contacts 802c in the Y-axis direction may be greater than a length of the second channel contacts 402c in the Y-axis direction. A horizontal shape of the second interconnection contacts 802c may be different from a horizontal shape of the first connection contacts 801c. For example, the horizontal shape of the second interconnection contacts 802c may be a circular shape.

In the semiconductor device according to an exemplary embodiment of the present inventive concept, the first bit contacts 601c may be electrically connected to the first vertical channel pillars 351 through the interconnection lines 500 and the first interconnection contacts 801c, and the second bit contacts 602c may be electrically connected to the second vertical channel pillars 352 through the second interconnection contacts 802c. In the semiconductor device according to an exemplary embodiment of the present inventive concept, the second bit contacts 602c and the interconnection lines 500 may be sufficiently spaced apart from each other. In the semiconductor device according to an exemplary embodiment of the present inventive concept, reliability thereof may be increased.

Figure 12:
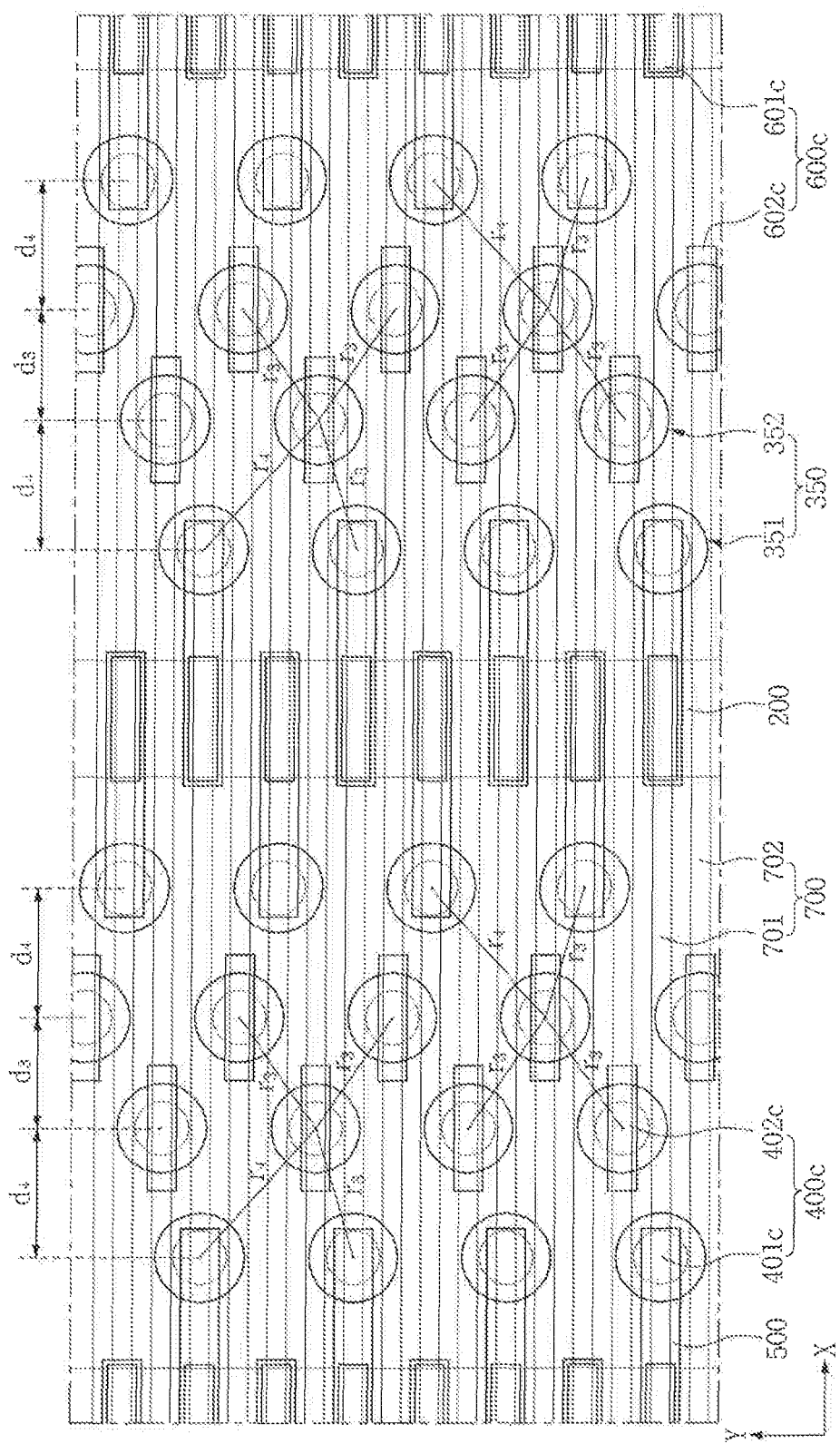
FIG. 12 is a view illustrating a layout of a semiconductor device in accordance with an exemplary embodiment of the present inventive concept.

FIG. 12 a view illustrating a layout of a semiconductor device in accordance with an exemplary embodiment of the present inventive concept.

Referring to FIG. 12, the semiconductor device according to an exemplary embodiment of the present inventive concept may include the semiconductor substrate 100, insulating layers 200, cell structures 300 including vertical channel pillars 350, channel contacts 400c including first channel contacts 401c and second channel contacts 402c, interconnection lines 500, bit contacts 600c including first bit contacts 601c and second bit contacts 602c, and bit lines 700 including first bit lines 701 and second bit lines 702. The vertical channel pillars 350 may include first vertical channel pillars 351 and second vertical channel pillars 352.

A distance d3 in the X-axis direction between adjacent second vertical channel pillars 352 may be different from a distance d4 in the X-axis direction between the first vertical channel pillar 351 and the adjacent second vertical channel pillar 352. For example, the distance d4 in the X-axis direction between the first vertical channel pillar 351 and the adjacent second vertical channel pillar 352 may be greater than the distance d3 in the X-axis direction between the adjacent second vertical channel pillars 352.

In the semiconductor device according to an exemplary embodiment of the present inventive concept, distances in the X-axis direction between rows of adjacent vertical channel pillars 350 may be different. In the semiconductor device according to an exemplary embodiment of the present inventive concept, the distance in the X-axis direction between the first vertical channel pillar 351 and the adjacent second vertical channel pillar 352 may be equal to or greater than the distance in the X-axis direction between the adjacent second vertical channel pillars 352. In the semiconductor device according to an exemplary embodiment of the present inventive concept, reliability thereof may be increased.

Figure 13:
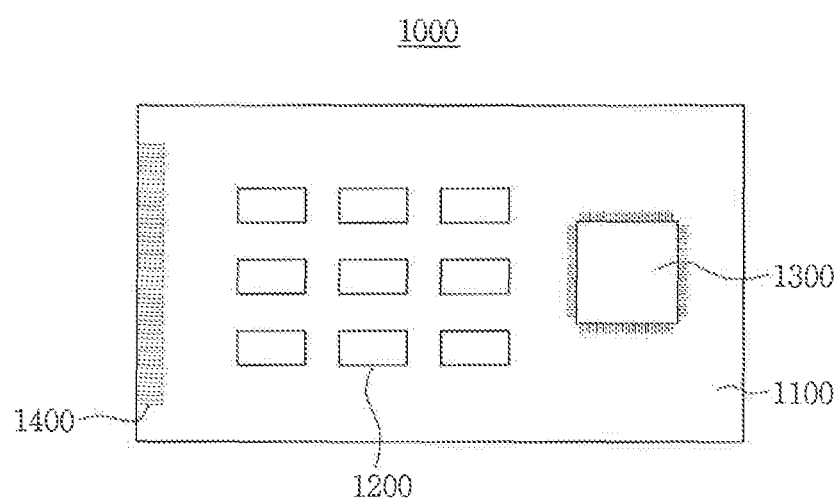
FIG. 13 is a schematic block diagram illustrating a semiconductor module including the semiconductor device in accordance with an exemplary embodiment of the present inventive concept.

FIG. 13 is a schematic block diagram illustrating a semiconductor module including the semiconductor device in accordance with an exemplary embodiment of the present inventive concept.

Referring to FIG. 13, the semiconductor module 1000 may include a module substrate 1100, a plurality of memories 1200, a microprocessor 1300, and input/output terminals 1400. The memories 1200, the microprocessor 1300, and the input/output terminals 1400 may be disposed on the module substrate 1100. The semiconductor module 1000 may include a memory card or a card package.

The memories 1200 and the microprocessor 1300 may include the semiconductor device in accordance with exemplary embodiments of the present inventive concept. In the semiconductor module 1000 according to an exemplary embodiment of the present inventive concept, reliability of the memories 1200 and the microprocessor 1300 may be increased.

Figure 14:
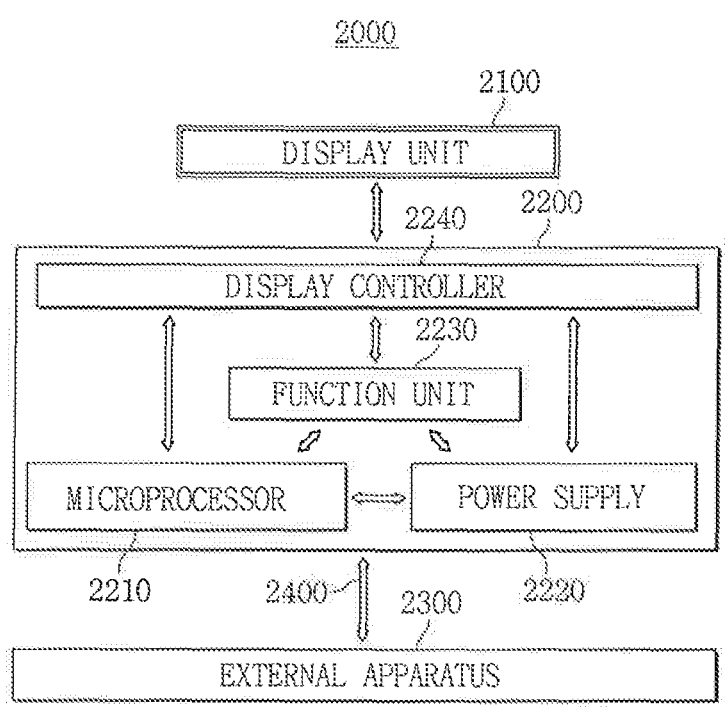
FIG. 14 is a schematic block diagram illustrating a mobile system including the semiconductor device in accordance with an exemplary embodiment of the present inventive concept.

FIG. 14 is a schematic block diagram illustrating a mobile system including the semiconductor device in accordance with an exemplary embodiment of the present inventive concept.

Referring to FIG. 14, a mobile system 2000 may include a display unit 2100, a body unit 2200, and an external apparatus 2300. The body unit 2200 may include a microprocessor 2210, a power supply 2220, a function unit 2230, and a display controller 2240.

The display unit 2100 may be electrically connected to the body unit 2200. The display unit 2100 may be electrically connected to the display controller 2240 of the body unit 2200. The display unit 2100 may display an image processed by the display controller 2240 of the body unit 2200.

The body unit 2200 may include a system board or motherboard including a printed circuit board (PCB) substrate. The microprocessor 2210, the power supply 2220, the function unit 2230, and the display controller 2240 may be disposed in or disposed on the body unit 2200.

The microprocessor 2210 may receive a voltage from the power supply 2220, and may control the function unit 2230 and the display controller 2240. The power supply 2220 may receive a constant voltage from an external power source, divide the voltage into various voltage levels, and supply those voltages to the microprocessor 2210, the function unit 2230, and the display controller 2240.

The power supply 2220 may include a power management integrated circuit (PMIC). The PMIC may supply a voltage to the microprocessor 2210, the function unit 2230, and the display controller 2240.

The function unit 2230 may perform various types of functions of the mobile system 2000. For example, the function unit 2230 may include various components performing wireless communication functions, such as displaying an image on the display unit 2100, and outputting a voice to a speaker, and may communicate with the external apparatus 2300. For example, the function unit 2230 may serve as an image processor of a camera.

When the function unit 2230 is connected to a memory card or the like, it may serve as a memory card controller. When the function part 2230 includes a Universal Serial Bus (USB), it may serve as an interface controller.

The microprocessor 2210 and the function unit 2230 may include the semiconductor device in accordance with exemplary embodiments of the present inventive concept. In the mobile system 2000 according to an exemplary embodiment of the present inventive concept, reliability thereof may be increased.

Figure 15:
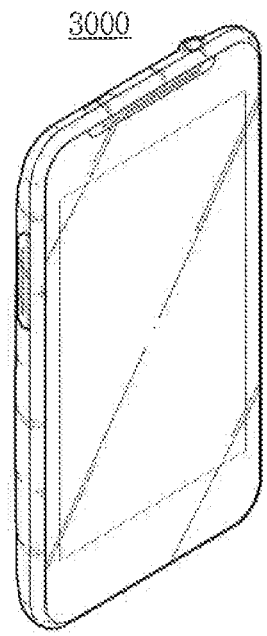
FIG. 15 is a schematic view illustrating a mobile apparatus including the semiconductor device in accordance with an exemplary embodiment of the present inventive concept.

FIG. 15 is a schematic view illustrating a mobile apparatus including the semiconductor device in accordance with an exemplary embodiment of the present inventive concept.

Referring to FIG. 15, the mobile apparatus 3000 may be a mobile wireless phone. The mobile apparatus 3000 may be a tablet PC. The mobile apparatus 3000 may include the semiconductor device in accordance with exemplary embodiments of the present inventive concept. In the mobile apparatus 3000 according to an exemplary embodiment of the present inventive concept, reliability thereof may be increased.

Figure 16:
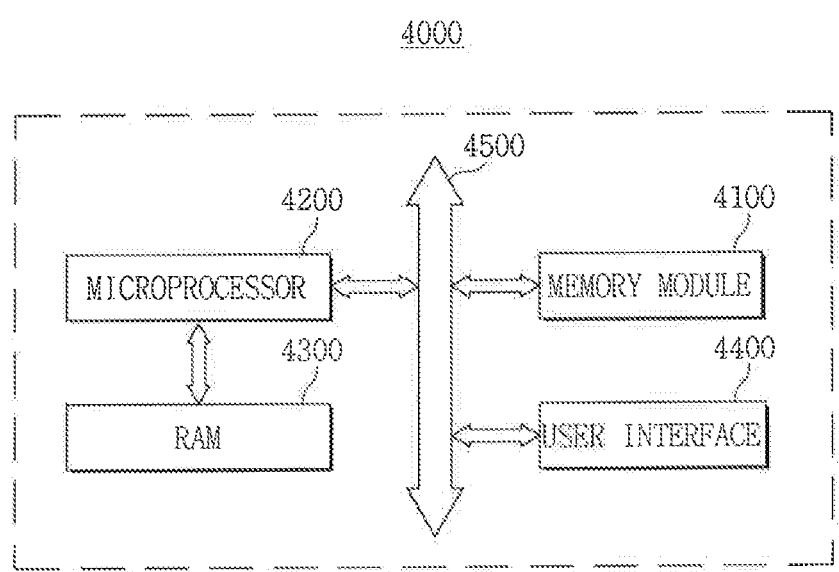
FIG. 16 is a schematic block diagram illustrating an electronic system including the semiconductor device in accordance with an exemplary embodiment of the present inventive concept.

FIG. 16 is a schematic block diagram illustrating an electronic system including the semiconductor device in accordance with an exemplary embodiment of the present inventive concept.

Referring to FIG. 16, the electronic system 4000 may include a memory module 4100, a microprocessor 4200, a random access memory (RAM) 4300, and a user interface 4400. The electronic system 4000 may be a system such as an LED lighting device, a refrigerator, an air conditioner, an industrial cutting machine, a welding machine, a vehicle, a vessel, an aircraft, or a satellite.

The memory module 4100 may store booting codes of the microprocessor 4200, data processed by the microprocessor 4200, or external input data. The memory module 4100 may include a controller and one or more memories.

The microprocessor 4200 may program and control the electronic system 4000. The RAM 4300 may be used as an operational memory of the microprocessor 4200.

The user interface 4400 may perform data communication using a bus 4500. The user interface 4400 may be used to input data to the electronic system 4000, or output data from the electronic system 4000.

The memory module 4100, the microprocessor 4200, and the RAM 4300 may include the semiconductor device in accordance with exemplary embodiments of the present inventive concept. In the electronic system 4000 according to an exemplary embodiment of the present inventive concept, reliability of the memory module 4100, the microprocessor 4200, and the RAM 4300 may be increased.

In the semiconductor device according to an exemplary embodiment of the present inventive concept, the interconnection lines may be sufficiently spaced apart from each other, and an area electrically connecting each of the interconnection lines to a corresponding bit line may be sufficiently obtained. Thus, in the semiconductor device according to an exemplary embodiment of the present inventive concept, reliability thereof may be increased.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:
1. A semiconductor device, comprising:
an insulating layer extending in a first direction;
a first vertical channel pillar disposed separately from the insulating layer;
a first interconnection line extending in a second direction perpendicular to the first direction, wherein the first interconnection line is electrically connected to the first vertical channel pillar;
a first bit line extending in the second direction, wherein the first bit line crosses over the first interconnection line and the first vertical channel pillar; and
a first bit contact overlapping the first interconnection line, wherein the first bit contact electrically connects the first interconnection line to the first bit line, and
wherein a length of the first bit contact in the second direction is greater than a length of the first bit contact in the first direction.

2. The semiconductor device of claim 1, wherein the first bit contact includes a portion overlapping the insulating layer.

3. The semiconductor device of claim 2, wherein the first bit contact crosses over the insulating layer.

4. The semiconductor device of claim 1, wherein a length of the first interconnection line in the first direction is smaller than a diameter of the first vertical channel pillar.

5. The semiconductor device of claim 1, further comprising:
a second vertical channel pillar disposed separately from the insulating layer and the first vertical channel pillar;
a second bit line disposed in parallel with the first bit line, wherein the second bit line crosses over the second vertical channel pillar; and
a second bit contact including a region on which the second bit line overlaps, wherein the second bit contact electrically connects the second vertical channel pillar to the second bit line, and wherein a length of the second bit contact in the second direction is greater than a length of the second bit contact in the first direction.

6. The semiconductor device of claim 5, wherein a shape of the second bit contact is the same as a shape of the first bit contact.

7. The semiconductor device of claim 5, further comprising a second interconnection line disposed in parallel with the first interconnection line, wherein the second interconnection line electrically connects the second vertical channel pillar to the second bit contact, and wherein the second bit contact overlaps the second interconnection line.

8. The semiconductor device of claim 7, wherein a length of the second interconnection line in the second direction is greater than a length of the first interconnection line in the second direction.

9. The semiconductor device of claim 7, wherein a distance in the second direction between the first vertical channel pillar and the first bit contact is substantially the same as a distance in the second direction between the second vertical channel pillar and the second bit contact.

10. A semiconductor device, comprising:
   a plurality of gate electrodes disposed on a semiconductor substrate;
   a first vertical channel pillar penetrating the plurality of gate electrodes;
   a first bit line disposed on the gate electrodes, wherein the first bit line crosses over the first vertical channel pillar;
   an interconnection line disposed between the first vertical channel pillar and the first bit line, wherein the interconnection line extends along the first bit line; and
   a first bit contact disposed between the interconnection line and the first bit line,
   wherein a horizontal length of the first bit contact is greater than a horizontal length of the first vertical channel pillar.

11. The semiconductor device of claim 10, further comprising:
   a second vertical channel pillar penetrating the gate electrodes, wherein the second vertical channel pillar is spaced apart from the first vertical channel pillar;
   a second bit line disposed on the gate electrodes, wherein the second bit line crosses over the second vertical channel pillar; and
   a second bit contact disposed between the second vertical channel pillar and the second bit line.

12. The semiconductor device of claim 11, wherein a horizontal length of the second bit contact is greater than a horizontal length of the second vertical channel pillar.

13. The semiconductor device of claim 11, further comprising an interconnection contact disposed between the second vertical channel pillar and the second bit contact.

14. The semiconductor device of claim 13, wherein a level of a lower surface of the second bit contact is the same as a level of a lower surface of the first bit contact.

15. The semiconductor device of claim 13, wherein a level of a lower surface of the second bit contact is higher than a level of an upper surface of the interconnection line.

16. A semiconductor device, comprising:
   a first vertical channel pillar comprising a first channel active pattern and a first channel core pattern;
   a second vertical channel pillar comprising a second channel active region and a second channel core pattern, wherein the second vertical channel pillar is disposed separately from the first vertical channel pillar;
   an insulating layer between the first vertical channel pillar and the second vertical channel pillar;
   a first bit contact electrically connected to the first vertical channel pillar and a first bit line, wherein the first bit contact is disposed above the insulating layer;
   a second bit contact electrically connected to the second vertical channel pillar and a second bit line, wherein the second bit contact is disposed above the second vertical channel pillar; and
   an interconnection line electrically connected to the first vertical channel pillar and the first bit contact, wherein a first side of the interconnection line is parallel with a second side of the interconnection line opposite to the first side of the interconnection line.

17. The semiconductor device of claim 16, wherein the first vertical channel pillar is closer to the insulating layer than the second vertical channel pillar.

18. The semiconductor device of claim 16, wherein a length of the first bit contact is smaller than a length of the insulating layer.

19. The semiconductor device of claim 16, wherein the first bit line and the second bit line are not in contact with each other.

20. The semiconductor device of claim 16, further comprising an impurity region disposed on the substrate, wherein the impurity region is disposed under the insulating layer.

* * * * *